United States Patent
Karlen et al.

(10) Patent No.: US 9,431,330 B2
(45) Date of Patent: *Aug. 30, 2016

(54) SYSTEM AND METHOD FOR METAL MATRIX MOUNTING SCHEME

(71) Applicant: Hamilton Sundstrand Corporation, Charlotte, NC (US)

(72) Inventors: Eric Karlen, Rockford, IL (US); William Louis Wentland, Rockford, IL (US); John Horowy, Rockford, IL (US); Debabrata Pal, Hoffman Estates, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 202 days.

This patent is subject to a terminal disclaimer.

(21) Appl. No.: 14/454,523

(22) Filed: Aug. 7, 2014

(65) Prior Publication Data

US 2016/0043023 A1 Feb. 11, 2016

(51) Int. Cl.
*H01L 23/495* (2006.01)
*H01L 23/14* (2006.01)
*H01L 23/50* (2006.01)
*H01L 21/48* (2006.01)

(52) U.S. Cl.
CPC ..... *H01L 23/49582* (2013.01); *H01L 21/4821* (2013.01); *H01L 23/14* (2013.01); *H01L 23/49534* (2013.01); *H01L 23/49541* (2013.01); *H01L 23/49568* (2013.01); *H01L 23/49575* (2013.01); *H01L 23/50* (2013.01)

(58) Field of Classification Search
CPC ............. H01L 27/1469; H01L 27/146; H01L 21/4857; H01L 23/5389; H01L 2224/0401; H01L 2224/484; H01L 24/24; H01L 24/82; H01L 2224/04105

See application file for complete search history.

(56) References Cited

U.S. PATENT DOCUMENTS

| 2008/0006914 | A1 | 1/2008 | Nagai |
| 2009/0311123 | A1* | 12/2009 | Zhang .................. C22C 1/0491 419/19 |
| 2013/0171843 | A1* | 7/2013 | Barnette ............ H01R 12/7088 439/70 |
| 2015/0098169 | A1* | 4/2015 | Karlen ..................... H01B 1/02 361/624 |

FOREIGN PATENT DOCUMENTS

| CN | 102332436 | | 1/2012 |
| CN | 102501006 B | * | 7/2013 |
| CN | 102534275 B | * | 10/2013 |

(Continued)

OTHER PUBLICATIONS

Extended European Search Report dated Jan. 5, 2016 in European Application No. 15178993.0.

*Primary Examiner* — Roy Potter
(74) *Attorney, Agent, or Firm* — Snell & Wilmer L.L.P.

(57) ABSTRACT

An integrated circuit assembly element formed via an additive manufacturing technique, such as mixing a conductive material with a memory metal to form a portion of a substrate in desired locations, such as along the footprint of die, are discussed herein. In operation (e.g. in response to thermal cycling of the assembly) the memory metal contracts while the conductive material expands. The result is an element having reduced thermal expansion, which can be net zero coefficient of thermal expansion and/or be catered to the coefficient of thermal expansion of a desired material, such as the silicon die.

15 Claims, 5 Drawing Sheets

(56) References Cited

FOREIGN PATENT DOCUMENTS

| EP | 2860737 | 4/2015 |
| EP | 2892310 | 7/2015 |
| GB | 2311414 | 9/1997 |
| JP | 2001060638 | 3/2001 |
| JP | 2012089343 | 5/2012 |
| KR | 20010017038 | 3/2001 |

* cited by examiner

SYSTEM AND METHOD FOR METAL MATRIX MOUNTING SCHEME

FIELD

The present disclosure relates to thermal expansion, and more particularly, to systems and methods of utilizing memory metal and/or additive manufacturing in conductive assemblies.

BACKGROUND

In conventional integrated circuits, die attachment is the step during which a die is mounted and fixed to the package or support structure. A die in the context of integrated circuits is a small block of semiconducting material, on which a given functional circuit is fabricated. For high-powered applications, the die is usually eutectic bonded onto the package, using e.g. gold-tin or gold-silicon solder. For low-cost, low-powered applications, the die is often glued directly onto a substrate, such as a printed wiring board, using a solder or epoxy adhesive. Heat is often generated at die interfaces and attachment locations during operation of the device. This heat may result in thermal expansion of components. The heat dissipated at the die attachment location and associated thermal expansion may be an important system design consideration.

SUMMARY

The present disclosure relates to an electrical distribution system. According to various embodiments a bus bar having a first portion comprising a thermally conductive material and a second portion is disclosed. The second portion may comprise a memory metal internal framework the thermally conductive material applied to the memory metal internal framework through an additive manufacturing technique. The composition of the memory metal internal framework and the electrically conductive material comprise a substantially net zero coefficient of thermal expansion during operation of the bus bar.

According to various embodiments, a surface mounted silicon die attachment process comprising is disclosed herein. The process may include coupling the surface mounted silicon die to a substrate such the desired thermal transfer path the surface mounted silicon die overlaps a first portion of the substrate comprising a thermally conductive material. The process may include coupling the surface mounted silicon die to a substrate such that the perimeter of the footprint of the surface mounted silicon die overlaps a second portion of substrate comprising a composition of memory metal and thermally conductive material. The composition of memory metal and thermally conductive material comprise a substantially net zero coefficient of thermal expansion during operation of surface mounted silicon die.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration and their best mode. While these exemplary embodiments are described in sufficient detail to enable those skilled in the art to practice the disclosure, it should be understood that other embodiments may be realized and that logical changes may be made without departing from the spirit and scope of the disclosure. Thus, the detailed description herein is presented for purposes of illustration only and not of limitation. For example, the steps recited in any of the method or process descriptions may be executed in any order and are not necessarily limited to the order presented. Furthermore, any reference to singular includes plural embodiments, and any reference to more than one component or step may include a singular embodiment or step.

As mentioned above, integrated circuit dies may be coupled to a substrate, such as a metal substrate. The coefficient of thermal expansion of an attachment location, such as on a substrate, (e.g., bus bar), and the die may be different. This difference may result in thermal stress on the resultant assembly in response to ambient and die temperature fluctuation. While not solving the problem but creating a stronger bond, conventionally, an electrically conductive epoxy may be utilized to couple the die to the substrate. This procedure is expensive and often lacks a conductive path of reliable efficiency.

According to various embodiments, a memory metal, shape alloy or smart metal may be embedded into portions of the substrate and/or a substrate may be formed of a memory metal and conducting material mixture. For instance, the memory metal may be a shape memory alloy, such as nitinol wire (nickel titanium alloy). Nitinol is a nickel-titanium alloy distinguished from other materials by its shape memory and super-elastic characteristics. Shape memory alloys are able to show an elastic deformation behavior. A super-elastic characteristic may be referred to as a mechanical shape memory effect or super elasticity. Super-elasticity is caused by the stress-induced phase transformation from a high temperature phase into a low temperature phase. The strain related to this phase transformation is fully or at least partially fully reversible after removing the stress. In this way, the stress and/or fatigue at or near metal substrate/silicon interface caused by different effective coefficients of thermal expansion may be minimized.

Electrical conductivity, thermal conductivity and mechanical strength are all important design considerations. Matching and/or having within an acceptable range of thermal expansion of parts in an integrated circuit component and/or integrated circuit assembly may also be an important design consideration.

Figure 1:
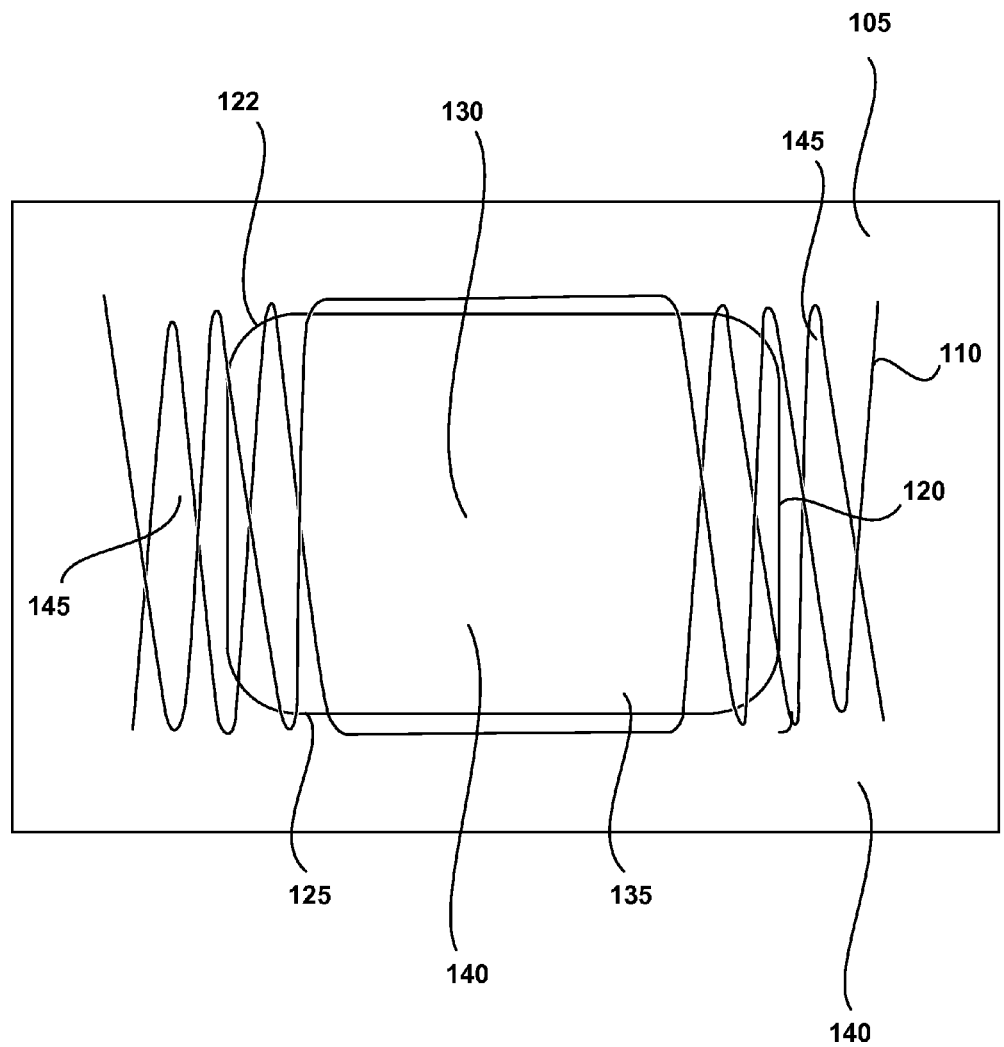
FIG. 1 is a representative diagram of a die attachment technique, in accordance with various embodiments.
Figure 2:
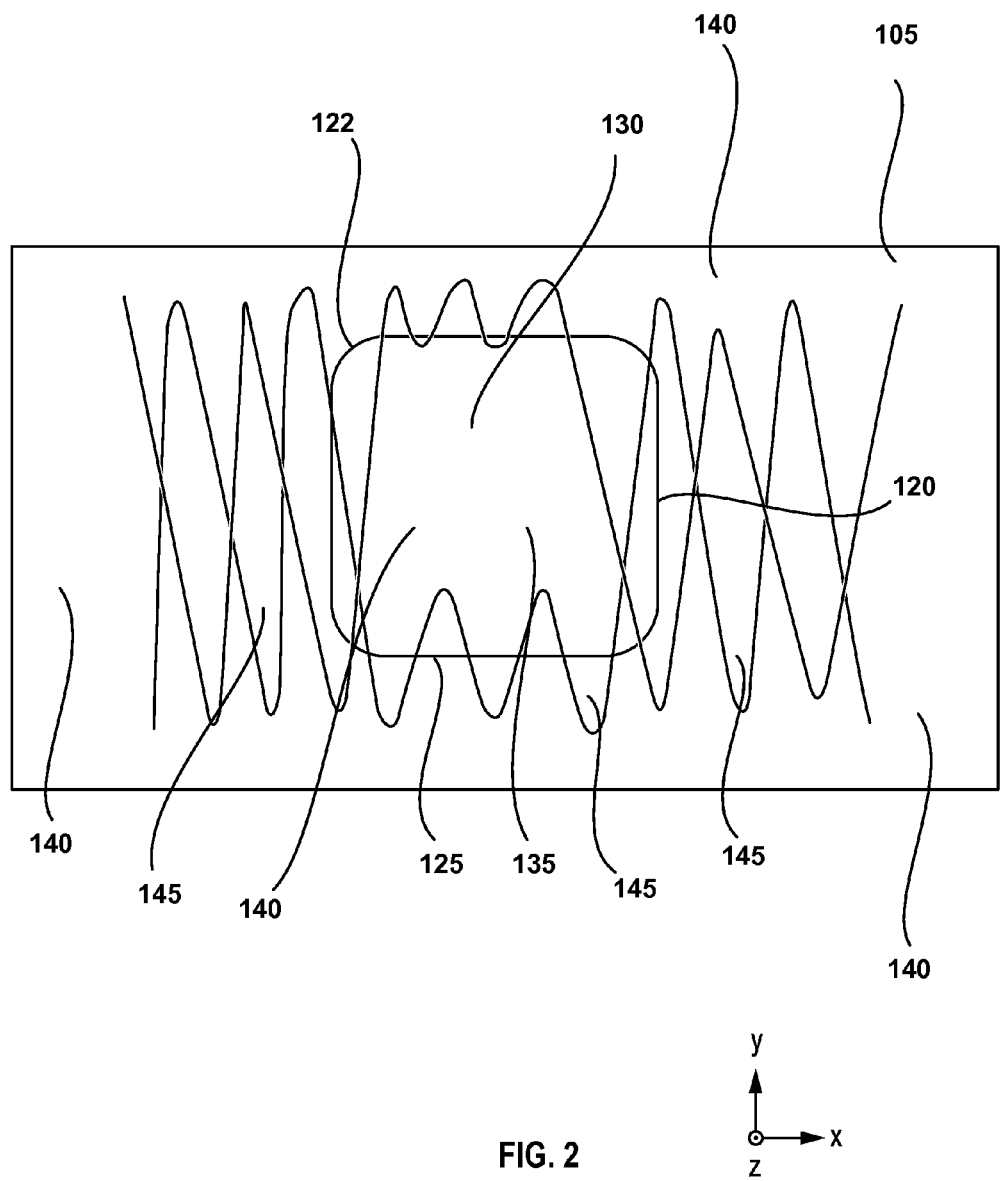
FIG. 2 is a representative diagram of a die attachment technique, in accordance with various embodiments.
Figure 3:
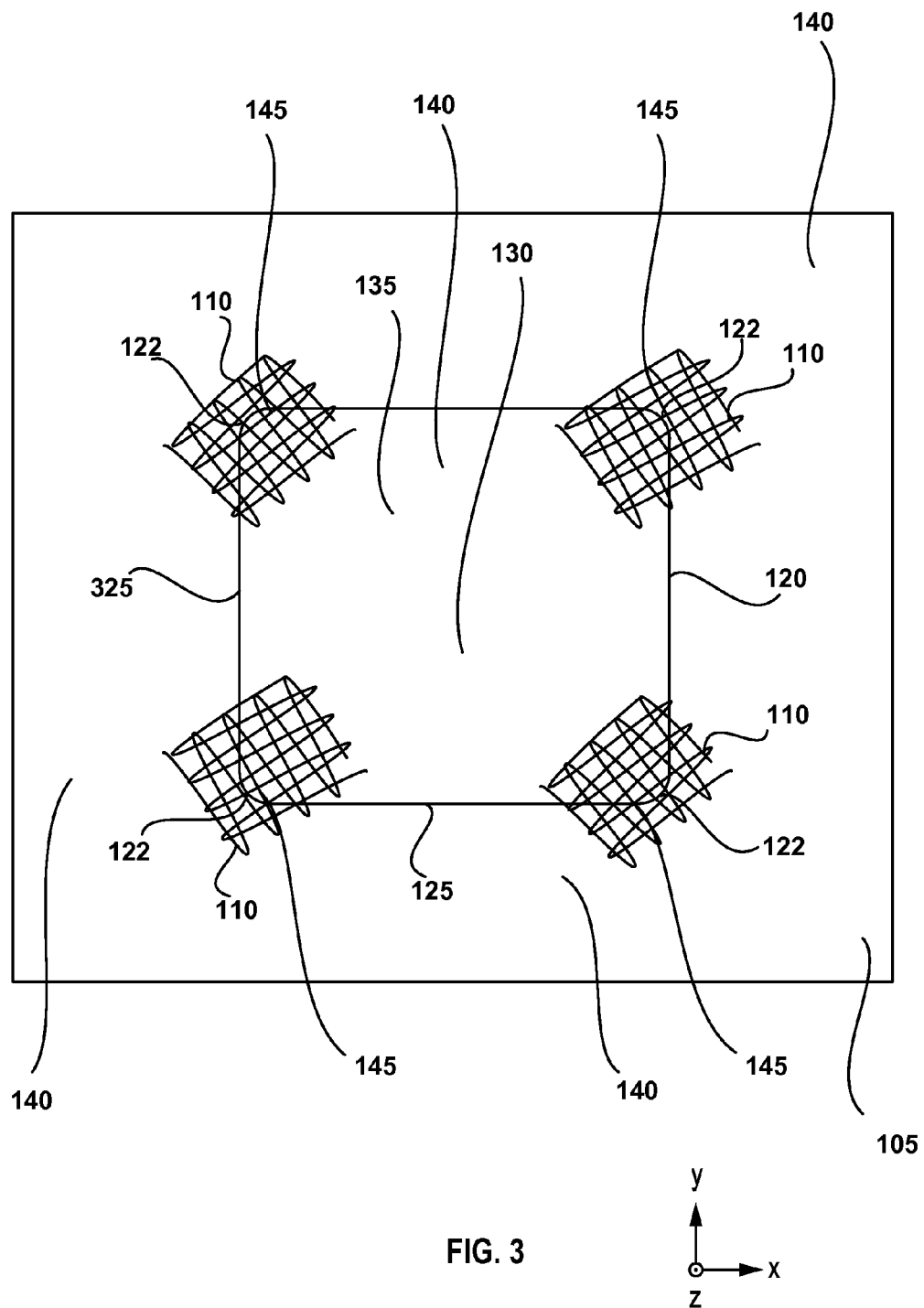
FIG. 3 is a representative diagram of a die attachment technique, in accordance with various embodiments.

According to various embodiments and with reference to FIGS. 1 through 3, the location of the embedded memory metal 110 with respect to the thermal transfer path 130 of the die 135 may be a design constraint. Stated another way, it may be beneficial to position embedded memory metal 110 outside of the main heat transfer pad and/or outside of the active die area (e.g., path 130). In this way, the memory metal 110 may be located toward the perimeter (e.g., sides 120, 125) and/or the corners 122 of the die 135. Due to the poor thermal conductivity of memory metal 110 in general, should the memory metal 110 be located in the path 130 of thermal conduction, an undesirable resistance to heat transfer may occur. Removing heat from a device in a direct and efficient fashion is desirable.

According to various embodiments, thermal expansion may be restricted in selective areas, such as along a perimeter formed by sides 120, 125 of the die 135 and/or at a corner 122 of a die 135, and moderated other areas. In according to various embodiments, thermal expansion may be restricted in selective areas only. Power devices attached to a substrate may be subjected to thermal cycling due to self heating or ambient temperature change. Failures associated with this thermal cycling are generally observed in proximity to a corner area of the die, as the effect of this thermal stress is typically at a maximum in proximity to the corners. Generally, thermal stress is at a minimum near the center (e.g., proximate path 130) of the die 135. Thus, a higher proportion of embedded memory metal 110 may be preferably located towards the corners 122 or towards the edges (e.g., sides 120, 125) of the die 135. In this way, the thermal coefficient of expansion similarity may be promoted near the edges/sides 120, 125 of the die 135 and deemphasized where its benefits are reduced such as in the center region, such as near path 130. In this way, the center region may available to promote heat transfer (e.g., path 130).

In accordance with various embodiments and with reference to FIGS. 1 through 3, a representation of a surface mounted integrated circuit die ("die") attachment technique and system is depicted. Die 135, such as a die of a power distribution system, is illustrated. Die 135 may be generally rectangular. A memory metal 110 framework of the substrate is depicted in proximity to die 135. For instance, the substrate may be formed of a shape memory metal 110 and/or shape memory metal alloy, embedded using additive manufacturing in a bus bar that has high temperature silicon dies coupled to a surface, such as its top surface. Specifically, the shape memory metal may be embedded in preferred regions of the die 135 attach points. This layout may be configured to reduce differences in coefficient of thermal expansion between materials, such as the silicon dies 135 and portions of the substrate.

According to various embodiments, the substrate 105 may be formed from an aluminum matrix with nitinol wires embedded into portions of this matrix. At least a portion of a substrate 105 (e.g., bus bar) coupled at the die attachment location is formed from a plurality of materials. For instance, a first portion 140 of the substrate 105 may be formed from a traditional conductive material, such as brass, nickel, silver, gold, zinc, iron, copper or aluminum. The first portion 140 may be positioned proximate at least one of the center of the footprint of the surface mounted silicon die 135 and/or a desired thermal transfer path 130 the surface mounted silicon die 135. A second portion 145 of the substrate may be formed from a memory metal, shape alloy or smart metal such as nitinol (nickel titanium alloy) and traditional conductive material combination and/or composition. The footprint of the die 135 preferably overlaps the first portion 140 and second portion 145. According to various embodiments and with reference to FIG. 1, the second portion 145 is generally located along at least a portion of one side (e.g., along a perimeter formed by sides 120, 125) of the die 135. For example the perimeter of the die may have two sets of substantially parallel sides 120, 125 respectively. According to various embodiments with reference to FIG. 2, the second portion 145 is generally located along and/or such that it overlaps a portion of the perimeter formed by sides 120, 125 of the die 135. According to various embodiments with reference to FIG. 3, the second portion 145 is generally located along at the corners 122 of the die 135. The second portion 145, (e.g., the memory metal 110 composition) may overlap portions of the die 135 in various locations. The angle of the spans of each length of memory metal 110 within the mesh-like pattern of the memory metal 100 conductive material composition may be oriented in any desired angle and/or orientation. According to various embodiments, a percentage of the lengths of memory metal 110 may be arranged to cross and/or overlap the footprint of the die 135. For instance, at least a portion of the lengths of memory metal 110 may be arranged at a 45 degree angle over a corner 122 of the die 135. Notably, the spans of the perimeter between corners 325 along side 120 of die 135 may not comprise the second portion 145 (e.g., memory metal) and instead comprise solely the first portion 140 of substrate. Any combination of the former layouts of memory metal as shown in FIGS. 1-3 may be utilized, as desired. The ratios of the composition of the memory metal and the thermally conductive material in the second portion 140 (e.g., the memory metal thermally conductive composite material) may comprise a coefficient of thermal expansion selected based on the coefficient of thermal expansion of a surface mounted silicon die.

According to various embodiments and with renewed reference to FIGS. 1 through 3, memory metal 110 may be laid out in a loosely arranged mesh-like pattern in desired locations. This pattern may be randomized such that lengths of memory metal 110 may traverse various directions, such as the X and Y axes and angles in between the X and Y axes. In this way, substantially uniform restraint of expansion may be achieved in the X and Y directions in desired locations. Any portion of the footprint of a surface mounted silicon die 135 may overlap section a memory metal mesh-like pattern of material. For instance, this may include the entire footprint and/or desired locations, such as where thermal transfer less desirable than reduced relative thermal expansion. In this way, thermal conduction through the thickness of the substrate (e.g., the bus bar) may be promoted.

Layers of the memory metal 110 may be laid out in a loosely arranged mesh-like pattern and may be stacked in the Z direction to add thickness. Layers adding thickness may be added in any direction. The mesh-like pattern may be formed from a plurality of discontinuous sections and/or lengths of memory metal.

According to various embodiments a structure of memory metal (e.g., nitinol) may be arranged to form a mesh-like pattern and/or skeleton in discrete locations relative to a die to which an additive manufacturing layer or layers may be added. For instance, a cold spray of particles 560 may be applied to the mesh-like skeleton (See FIG. 5). In other areas, a mesh or framework of spray particle material may be applied a cold spray of particles. In response to a suitable quantity of layers being applied, a bus bar may be formed. According to various embodiments, a three dimensional printing process may be utilized to produce layers of a substrate having various material properties such as a memory metal and conductive material combination. Utilizing the techniques and designs described herein also significantly improve the manufacturability as well as the survivability of the product/assembly over the life of the product. According to various embodiments, laser powder or wire deposition methods may be utilized to form elements of the disclosure. For instance laser deposition is a process in which metal powder is injected into the focused beam of a high-power laser under tightly controlled atmospheric conditions. The focused laser beam melts the surface of the target material and generates a small molten pool of base material. Powder delivered into this same spot is absorbed into the melt pool, thus generating a deposit which may form a 3D structure. Multiple materials such as a memory metal and a metal matrix material, may be injected substantially simultaneously to grow a three dimensional structure in a single process.

In accordance with various embodiments, bus bar connection/attach points, and various attributes may also be formed by ultrasonic additive manufacturing where the memory metal is embedded into a metal matrix created by the successive addition of material. Thus, in this process, a partial substrate and/or a portion of a substrate may be formed to which memory metal is embedded into. Additional additive manufacturing layers of any material composition may be added to this structure if desired.

Aluminum, being an isotropic material, will thermally expand substantially equally in all directions. The orientation of the memory metal and/or the memory metal mesh may be designed to exploit contraction in any direction in various areas relative to the die. Thus, the effects of thermal expansion on the combination of the two materials may be substantially balanced in these discrete areas (e.g., die attachment locations). The balancing of thermal expansion may be desirable along the perimeter and/or corner of the footprint of a surface mounted silicon die.

Figure 4:
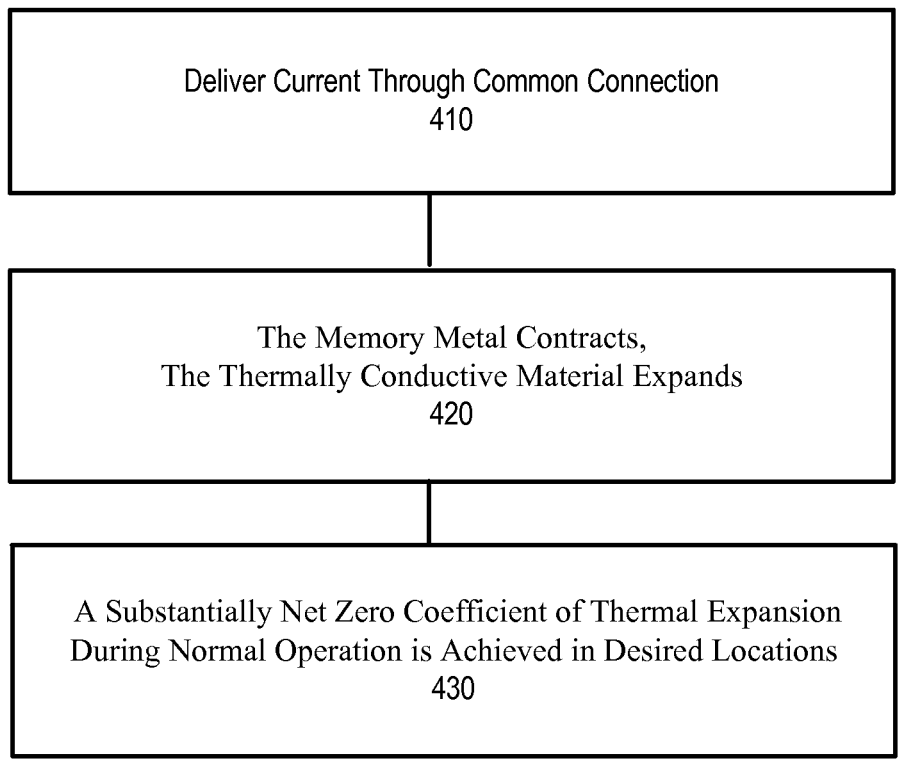
FIG. 4 depicts a common connection assembly, such as a substrate (e.g., bus bar), in operation in accordance with various embodiments.

With reference to FIG. 4, in operation (e.g. in response to delivering current through a common connection (e.g., bus bar)), the memory metal contracts while the aluminum expands during temperature elevation due to thermal expansion (step 410, 420). For instance, as the temperature rises in bus bar 100 by virtue of current running through the bus bar, the memory metal, (e.g., nitinol material) will experience a phase change and is configured to contract while the aluminum matrix expands. The result is bus bar having reduced thermal expansion, which can be a substantially net zero coefficient of thermal expansion (step 430). Stated another way, the composition of the memory metal and the thermally conductive material comprise a substantially net zero coefficient of thermal expansion during operation. In the alternative, the composition of the memory metal and the thermally conductive material comprise a coefficient of thermal expansion determined based on the coefficient of thermal expansion of a second material, such as the coefficient of thermal expansion of the surface mounted silicon die. The volume percent of traditional bus bar material to memory metal may be any volume percent. For instance, the relationship may be about 50 percent traditional bus bar material to about 50 percent memory metal by volume. According to various embodiments, the relationship may be between about 40-90 percent memory metal by volume to a respective amount of traditional bus bar material.

Figure 5:
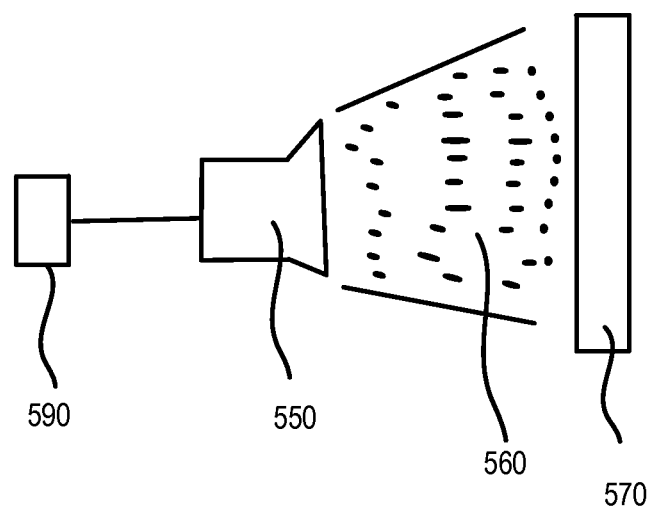
FIG. 5 is a representative block diagram of additive manufacturing process, in accordance with various embodiments.

An example of an additive manufacturing technique used herein may include ultrasonic consolidation (or ultrasonic additive manufacturing); cold spray and/or the like (see FIG. 5). For instance, the term "cold spray" as used herein may include a process by which particles 560 are deposited by means of ballistic impingement upon a suitable substrate at supersonic velocities to form a layer 570 of a substrate or a free-standing structure. The ballistic impingement may be via a supersonic nozzle 550. The particles 560 may be fed by feeder system 590 which may toggle between various source material stocks. Also, pressure and heat may be provided by the feeder system 590. The melting of particles that occurs during most thermal spray processes can result in oxidation of both the coating and substrate materials. The resulting oxides decrease the adhesive and cohesive strengths of the coating. The cold spray process may avoid such reactions. Cold spay process may be highly precise if desired allowing for materials to be formed in particular patterns and orientations.

Though they may span a multitude of applicable applications, the concepts described herein may be utilized in a power distribution system. The system may be configured for and designed to address aircraft power distribution loads. According to various embodiments, the system may be configured for driving motors.

According to various embodiments, an integrated circuit assembly element maybe formed via an additive manufacturing technique, such as mixing a conductive material with a memory metal to form a portion of a substrate in desired locations, such as along the footprint of die. In operation (e.g. in response to thermal cycling of the assembly) the memory metal contracts while the conductive material expands. The result is an element having reduced thermal expansion, which can be net zero coefficient of thermal expansion and/or be catered to the coefficient of thermal expansion of a desired material, such as the coefficient of thermal expansion of the silicon die.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." As used herein, the phrases "make contact with", "touch", "interface with" and "engage" may be used interchangeably.

Systems, methods and apparatus are provided herein. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments. Different cross-hatching is used throughout the figures to denote different parts but not necessarily to denote the same or different materials.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A bus bar comprising:
    a first portion comprising:
        a thermally conductive material; and
    a second portion comprising:
        a memory metal internal framework; and
        the thermally conductive material applied to the memory metal internal framework through an additive manufacturing technique to form a memory metal thermally conductive composite material,
    wherein the memory metal thermally conductive composite material comprise a substantially net zero coefficient of thermal expansion during operation of the bus bar.

2. The bus bar of claim 1, wherein the additive manufacturing technique is at least one of ultrasonic disposition, laser deposition, three dimensional printing or cold spraying.

3. The bus bar of claim 1, wherein the thermally conductive material is at least one of brass, nickel, silver, gold, zinc, iron, copper or aluminum.

4. The bus bar of claim 1, wherein the memory metal internal framework is a nickel-titanium alloy.

5. The bus bar of claim 1, wherein the second portion is positioned such that it at least partially overlaps a footprint a surface mounted silicon die.

6. The bus bar of claim 1, wherein the second portion is positioned such that it at least partially overlaps a perimeter of a footprint of a surface mounted silicon die.

7. The bus bar of claim 6, wherein the first portion is positioned proximate at least one of a center of the footprint of the surface mounted silicon die or a desired thermal transfer path the surface mounted silicon die.

8. The bus bar of claim 6, wherein the second portion is positioned such that it overlaps a corner of the footprint of the surface mounted silicon die.

9. The bus bar of claim 1, wherein a layout of the memory metal internal framework is randomized.

10. The bus bar of claim 1, wherein the memory metal internal framework forms a pattern such that lengths of memory metal are oriented along at least one of along a X axis, along a Y axis, or along an angle between the X and Y axes.

11. The bus bar of claim 1, wherein the ratios of the composition of the memory metal internal framework and the thermally conductive material in the memory metal thermally conductive composite material comprise a coefficient of thermal expansion selected based on the coefficient of thermal expansion of a surface mounted silicon die.

12. A surface mounted silicon die attachment process comprising:
    coupling a surface mounted silicon die to a substrate such the desired thermal transfer path of the surface mounted silicon die overlaps a first portion of the substrate comprising a thermally conductive material; and
    coupling the surface mounted silicon die to the substrate such that a perimeter of a footprint of the surface mounted silicon die overlaps a second portion of substrate comprising a composition of a memory metal and the thermally conductive material,
    wherein the composition of the memory metal and the thermally conductive material comprise a substantially net zero coefficient of thermal expansion during operation of the surface mounted silicon die.

13. The surface mounted silicon die attachment process of claim 12, wherein the thermally conductive material is at least one of brass, nickel, silver, gold, zinc, iron, copper or aluminum.

14. The surface mounted silicon die attachment process of claim 12, wherein a memory metal is a nickel-titanium alloy.

15. The surface mounted silicon die attachment process of claim 12, wherein the second portion of substrate is positioned such that it overlaps a corner of the footprint of the surface mounted silicon die.

* * * * *